United States Patent
Holowick

(10) Patent No.: US 7,479,871 B2
(45) Date of Patent: Jan. 20, 2009

(54) RADIO FREQUENCY WARNING SYSTEM FOR FERROMAGNETIC THREATS

(75) Inventor: Erwin Holowick, Oakbank (CA)

(73) Assignee: MedNovus, Inc., Leucadia, CA (US)

( * ) Notice: Subject to any disclaimer, the term of this patent is extended or adjusted under 35 U.S.C. 154(b) by 267 days.

(21) Appl. No.: 11/472,809

(22) Filed: Jun. 21, 2006

(65) Prior Publication Data

US 2007/0296576 A1 Dec. 27, 2007

(51) Int. Cl.
*B60Q 1/00* (2006.01)

(52) U.S. Cl. .............................. 340/425.5; 340/539.21; 340/539.32

(58) Field of Classification Search .............. 340/425.5, 340/539.21, 539.23, 539.32, 572.1
See application file for complete search history.

(56) References Cited

U.S. PATENT DOCUMENTS

| | | | |
|---|---|---|---|
| 3,573,817 A | 4/1971 | Akers | |
| 6,150,936 A * | 11/2000 | Addy | 340/539.21 |
| 6,323,785 B1 * | 11/2001 | Nickell et al. | 340/539.21 |
| 6,888,456 B2 * | 5/2005 | Cheng et al. | 340/539.21 |
| 7,274,292 B2 * | 9/2007 | Velhal et al. | 340/539.32 |
| 2007/0188375 A1 * | 8/2007 | Richards et al. | 340/539.21 |
| 2007/0241904 A1 * | 10/2007 | Ozaki et al. | 340/539.21 |
| 2007/0247286 A1 * | 10/2007 | Drago et al. | 340/539.21 |

* cited by examiner

*Primary Examiner*—John A Tweel, Jr.
(74) *Attorney, Agent, or Firm*—Gerald W. Spinks

(57) ABSTRACT

A ferromagnetic threat warning system utilizing two or more radio frequency transmitters or transceivers. A remote transmitter or transceiver is attached to each ferromagnetic threat that may enter the area to be protected. A master receiver or transceiver is mounted at each door controlling entry into the area to be protected. Communication between any master unit and one or more remote units generates an alarm when one or more threat objects approaches within a preselected distance of any master unit. Approach of a threat object within the preselected distance from a door can be detected when the strength of a radio signal between the remote unit associated with the threat object and the master unit near the door reaches a predetermined level. Generation of an alarm can be initiated at either the affected remote unit or the affected master unit. Generation of an alarm at either the affected remote unit or the affected master unit can also result in generation of an alarm at the other of the two units.

19 Claims, 14 Drawing Sheets

A: (ALARM = TRUE) IF (SYSTEM ID = MATCH) AND (MSG SOURCE = 0) AND (RX SIGNAL > THRESHOLD)
B: (ALARM = TRUE) IF (SYSTEM ID = MATCH) AND (MSG SOURCE = 0) AND (ALARM = 1) AND (ID OF REMOTE = THIS REMOTE)

C: (ALARM = TRUE) IF (SYSTEM ID = MATCH) AND (MSG SOURCE = 1) AND (RX SIGNAL > THRESHOLD)
D: (ALARM = TRUE) IF (SYSTEM ID = MATCH) AND (MSG SOURCE = 1) AND (ALARM = 1) AND (ID OF MASTER = THIS MASTER)

| SYNC | SYSTEM ID | MSG SOURCE TYPE | MSG SOURCE ID | ALARM STATUS | ALARM SOURCE ID (OPTIONAL) |

0 = MASTER  
1 = REMOTE

0 = INACTIVE  
1 = ACTIVE

ID OF RECEIVED SIGNAL OVER THRESHOLD  
0 = RESERVED FOR ALARM TEST

FIG. 5

| SYNC | SYSTEM ID | MSG SOURCE TYPE = 0 | MASTER ID | ALARM = 0 |

FIG. 6

| SYNC | SYSTEM ID | MSG SOURCE TYPE = 0 | MASTER ID | ALARM = 1 | ID OF REMOTE OVER THRESHOLD |

FIG. 7

| SYNC | SYSTEM ID | MSG SOURCE TYPE = 1 | REMOTE ID | ALARM = 0 |

FIG. 8

| SYNC | SYSTEM ID | MSG SOURCE TYPE = 1 | REMOTE ID | ALARM = 1 | ID OF MASTER OVER THRESHOLD |

FIG. 9

E: (ALARM = TRUE) IF (SYSTEM ID = MATCH) AND (MSG SOURCE = 1) AND (RX SIGNAL > THRESHOLD)

J: (ALARM = TRUE) IF (SYSTEM ID = MATCH) AND (RX SIGNAL > THRESHOLD)
K: (ALARM = TRUE) IF (SYSTEM ID = MATCH) AND (ALARM =1)

| SYNC | SYSTEM ID | REMOTE ALARM STATUS | SIGNAL SOURCE ID |
|---|---|---|---|

0 = INACTIVE, 1 = ACTIVE

REMOTE TO MASTER

| SYNC | SYSTEM ID | MASTER ALARM STATUS | ALARM SOURCE ID |
|---|---|---|---|

0 = INACTIVE, 1 = ACTIVE

MASTER TO REMOTE

FIG. 18

RADIO FREQUENCY WARNING SYSTEM FOR FERROMAGNETIC THREATS

CROSS REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

1. Field of the Invention

This invention is in the field of methods and apparatus used in pre-screening to prevent entry of ferromagnetic threat objects into the vicinity of a magnetic resonance imaging (MRI) magnet.

2. Background Art

Even small ferromagnetic objects that are inadvertently carried into a magnetic resonance imaging examination room can become potentially lethal projectiles in the very high field and high field gradient surrounding the MRI magnet. Large ferromagnetic objects, such as oxygen tanks, floor scrubbers, tables, and pipe wrenches pose threat of great harm to patients undergoing MRI, as well as damage to the MRI instrument itself. Such objects are called "ferromagnetic threat objects" herein. A terrible accident occurred to a small boy when an oxygen tank was inadvertently brought into the magnet room, causing his death. Many "near-misses" have occurred, and most MRI centers can relate such potentially-dangerous incidents.

Oxygen tanks are painted green by convention, thus heightening the illusion that these are safe in a magnetic resonance environment, which is absolutely untrue. What is needed, then, is a way of ensuring that oxygen tanks, floor scrubbers, and other ferromagnetic threats are not brought into the magnet room under any circumstances. The present invention provides a method and apparatus for this purpose.

BRIEF SUMMARY OF THE INVENTION

In the preferred embodiment, the system of the present invention is comprised of a master transceiver module or radio unit, and at least one remote transceiver module or radio unit. In the following, the term "master gender" module or radio unit identifies the type of radio unit that is used as a master module, while the term "remote gender" module or radio unit identifies the type of radio unit that is used as a remote module. This terminology is used strictly as an aid in differentiating between the two different types of radio units.

The radio units periodically transmit radio frequency signals. Each radio signal has a predetermined transmission strength. Each signal can be encoded to identify the threat warning system. In some embodiments, as explained further below, each signal can be encoded to identify whether the gender of the transmitting unit is a master module or a remote module. Also, as explained further below, in some embodiments, each signal can be encoded to identify exactly which module is transmitting the signal. The master radio unit is mounted next to a door which provides entry into an area to be protected, such as an MRI magnet room. Each ferromagnetic threat object which may be brought near the MRI suite of rooms has a remote radio unit mounted thereon. An alarm condition is activated when one of the remote modules encroaches on an area within a preselected distance of the master module.

In the preferred embodiment, these master and remote radio units operate in a two-way communications methodology. In this embodiment, local alarms in either or both the master module and the encroaching remote module can be triggered. The triggering in either gender of module can be initiated when a signal received by the module reaches a predetermined signal strength level, if that signal was transmitted by a module of opposite gender from the receiving module. That is, a master module will only alarm upon receiving a signal from a remote module, and a remote module will only alarm upon receiving a signal from a master module. Also, when a non-alarming module receives a message encoded to indicate that another module has alarmed as a result of receiving a signal at the predetermined strength level from the non-alarming module, the non-alarming module will then activate its local alarm. This ensures that not only will the master module at the door alarm to indicate that a threat object is too close, but the particular encroaching threat object will also be identified by its local alarm.

Either the master unit or the encroaching remote unit might sense first that a received radio signal is above a predetermined signal strength, causing an alarm by that first unit. Eventually, the second of the two modules would also sense that a received signal has exceeded the predetermined signal strength, indicating that the predetermined safe separation distance has been encroached upon. The second module would then also activate its local alarm based on the received signal strength. This can be thought of as a "signal strength" dual alarming mode. However, as a rule, before this happens, the first alarming module will transmit a return signal encoded to signify that the first module is alarming, and further encoded to identify the second (non-alarming) module from which the predetermined level radio signal was received, resulting in the immediate generation of an alarm by the second module based upon the signal message contents, rather than upon signal strength. This can be thought of as a "mutual reinforcement" dual alarming mode.

In an alternative second embodiment, the remote modules can be only capable of transmitting, and the master module can be only capable of receiving. In this second embodiment, only the master module may alarm, and triggering of both modules may not be accomplished.

In an alternative third embodiment, the master module transmits on a first frequency and listens on a second frequency. The remote module transmits on the master module's listening frequency and listens on the master module's transmitting frequency. There is no need for a module gender ID. Gender identification for a module is accomplished by determining whether the module is transmitting on the first frequency or on the second frequency. In this third embodiment, either or both modules may alarm in a "signal strength" dual alarming mode.

In an alternative fourth embodiment, the master module transmits on one frequency and listens on a second frequency, as in the third embodiment. The remote module transmits on the master module's listening frequency and listens on the master module's transmitting frequency. Gender identification for a module is accomplished by determining whether the module is transmitting on the first frequency or on the second frequency. In this fourth embodiment, each signal is encoded with a unique module ID, so that both modules may alarm in a "mutual reinforcement" dual alarming mode. Both modules may also alarm in a "signal strength" dual alarming mode.

The operational radio frequency or frequencies of the system are selected to avoid interference with the MRI radio frequency or its harmonics.

The novel features of this invention, as well as the invention itself, will be best understood from the attached drawings, taken along with the following description, in which similar reference characters refer to similar parts, and in which:

BRIEF DESCRIPTION OF THE SEVERAL VIEWS OF THE DRAWINGS

FIG. 5 illustrates the basic radio digital message format;

FIG. 6 shows the radio digital message format which would be transmitted from a master module with the alarm inactive;

FIG. 7 shows the radio digital message format which would be transmitted from a master module with the alarm active;

FIG. 8 shows the radio digital message format which would be transmitted from a remote module with the alarm inactive;

FIG. 9 shows the radio digital message format which would be transmitted from a remote module with the alarm active;

FIG. 18 illustrates the basic radio digital message format, in the fourth embodiment.

DETAILED DESCRIPTION OF THE INVENTION

Figure 1:
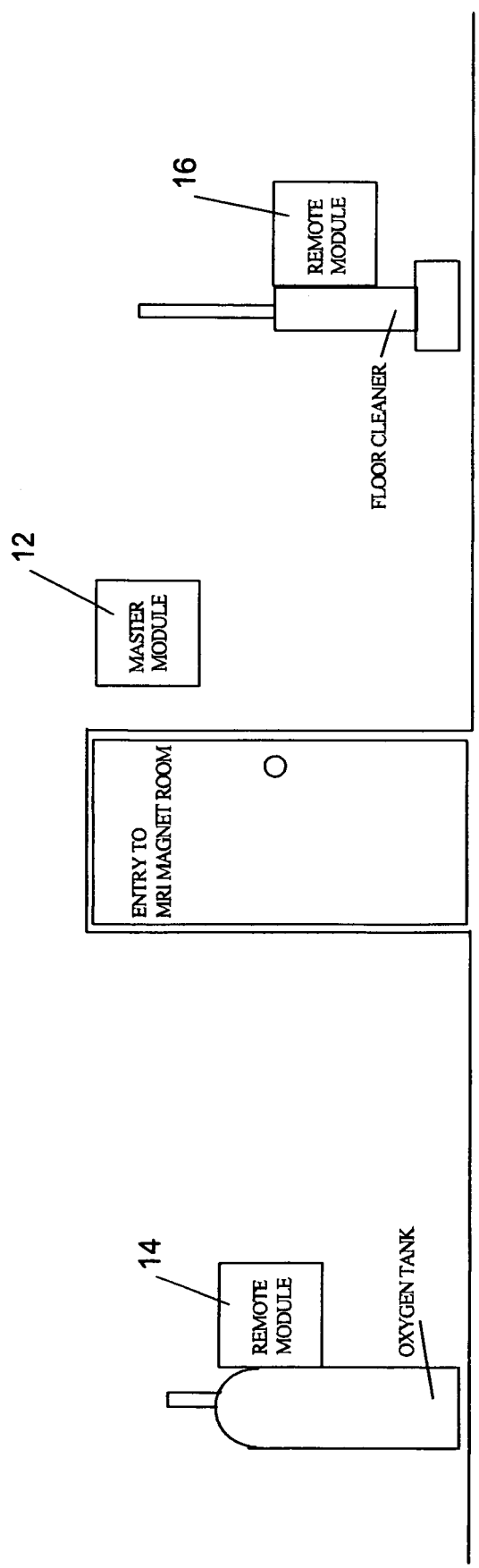
FIG. 1 is a sketch of a suggested positioning of the system components.

As shown in FIG. 1, a master module or radio unit 12 can be located adjacent to the entry door of the MRI magnet room. It can have audible and visible alarm outputs, such as a siren and flashing lights. Remote modules or radio units 14, 16 can be attached to ferromagnetic threat objects that may be brought into the vicinity of the MRI magnet. The remote modules 14, 16 can be self-contained, battery operated modules that are attached to the ferromagnetic objects, such as oxygen tanks and floor polishers or scrubbers.

The master module 12 and the remote modules 14, 16 can all periodically transmit a radio frequency transmission, at a pre-set signal level. The transmission can include digital data to identify the system identification, the gender of the message source (whether it is a master or remote), and alarm status (active or inactive). The length of the transmission can be short, and the periodicity can be randomized.

The master module 12 and the remote modules 14, 16 all listen for valid radio messages and measure the corresponding received radio signal strength. The contents of the message can validate the fact that the transmitting module is in the same threat warning system as the receiving module, and that the transmitting module is the master radio unit 12 and the receiving module is a remote radio unit 14, 16, or vice versa, while the signal strength is an indication of proximity.

There are two means by which an alarm can be initiated, via an indication that the signal strength measurement has reached the predetermined level, and via the indication that one of the modules 12, 14, 16 has initiated an alarm. The second means of initiating an alarm will only initiate an alarm in the module which transmitted the first radio signal which was received at the predetermined strength level.

Figure 2:
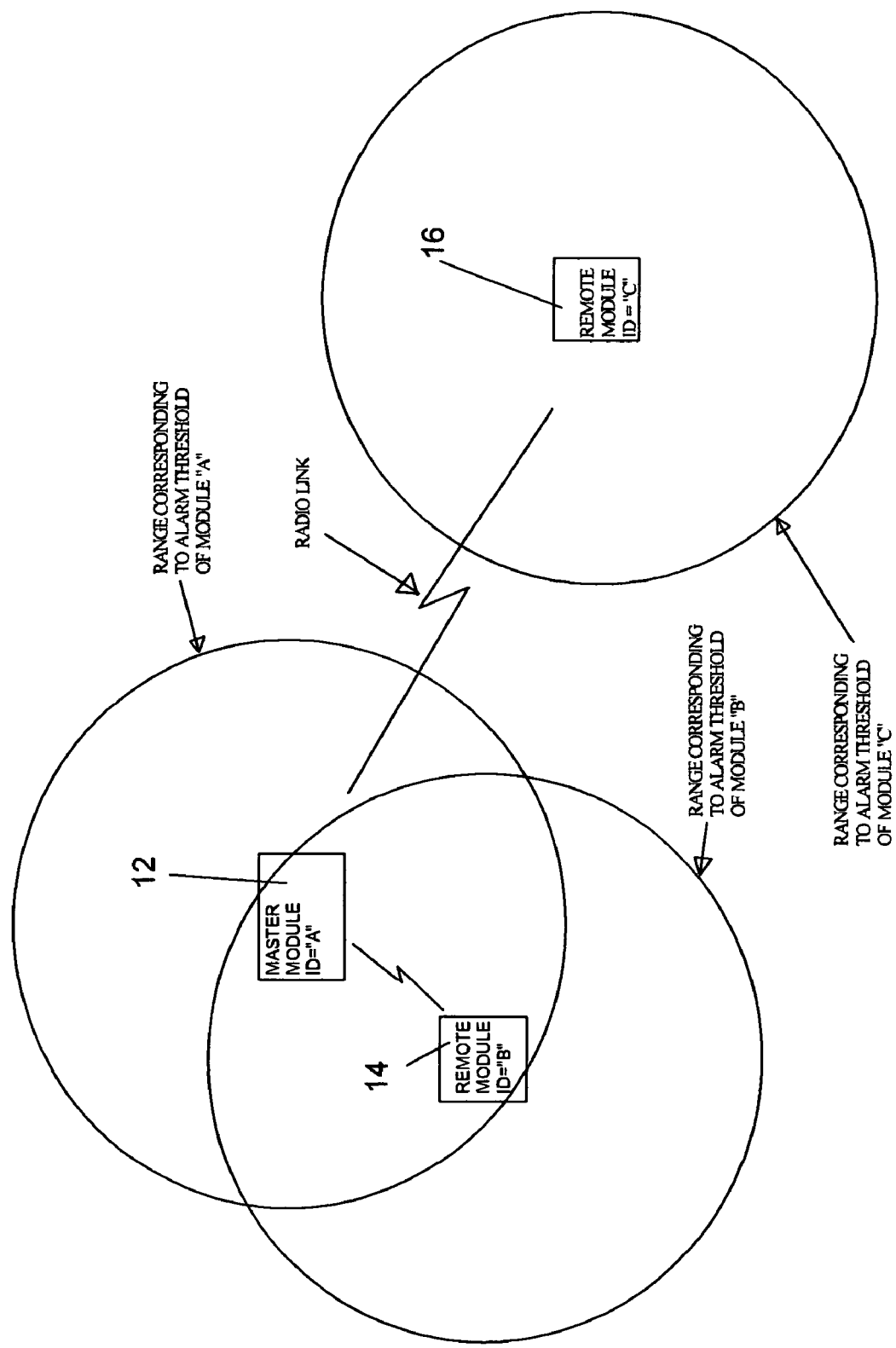
FIG. 2 illustrates the triggering relationship between modules in a first embodiment.

FIG. 2 illustrates the first means of initiating an alarm, via the signal strength. If a radio signal is received from the same system identification, from an opposite gender of radio unit, and is above a pre-determined receive threshold, then a local alarm condition is activated at the receiving module. The circles represent the distance corresponding to a predetermined received signal strength at which an alarm is to be generated. The signal can also include an inactive alarm flag in the message. A local alarm condition can result in activating the local visible and audible alarm outputs associated with the receiving module. Further, the local alarm condition at the receiving module can result in the receiving module transmitting a radio signal message indicating that an alarm is active, including identifying the unique unit identifier of the radio unit which transmitted the original radio signal which was received at a strength which is over the predetermined threshold.

In the second means of triggering an alarm, if a radio signal is received from a radio unit having the same threat warning system identification, from an opposite gender radio unit, with the alarm condition set to active in the incoming message, and the incoming message contains a unique identifier that matches the unique identifier of the receiving module, then a local alarm condition is activated at the receiving unit, regardless of the received signal strength measurement.

The two means of generating an alarm provide redundancy in the preferred embodiment. The proximity of the two modules is monitored with independent signal strength circuits in each module, plus if one of the two triggers an alarm, then that in turn triggers the alarm at the paired module via the radio message contents.

The functional blocks of the two genders or types of modules or radio units are shown in the following Figures, using logic hardware. Alternatively, these functions could be performed using a micro-controller containing appropriate associated hardware and firmware.

Figure 3:
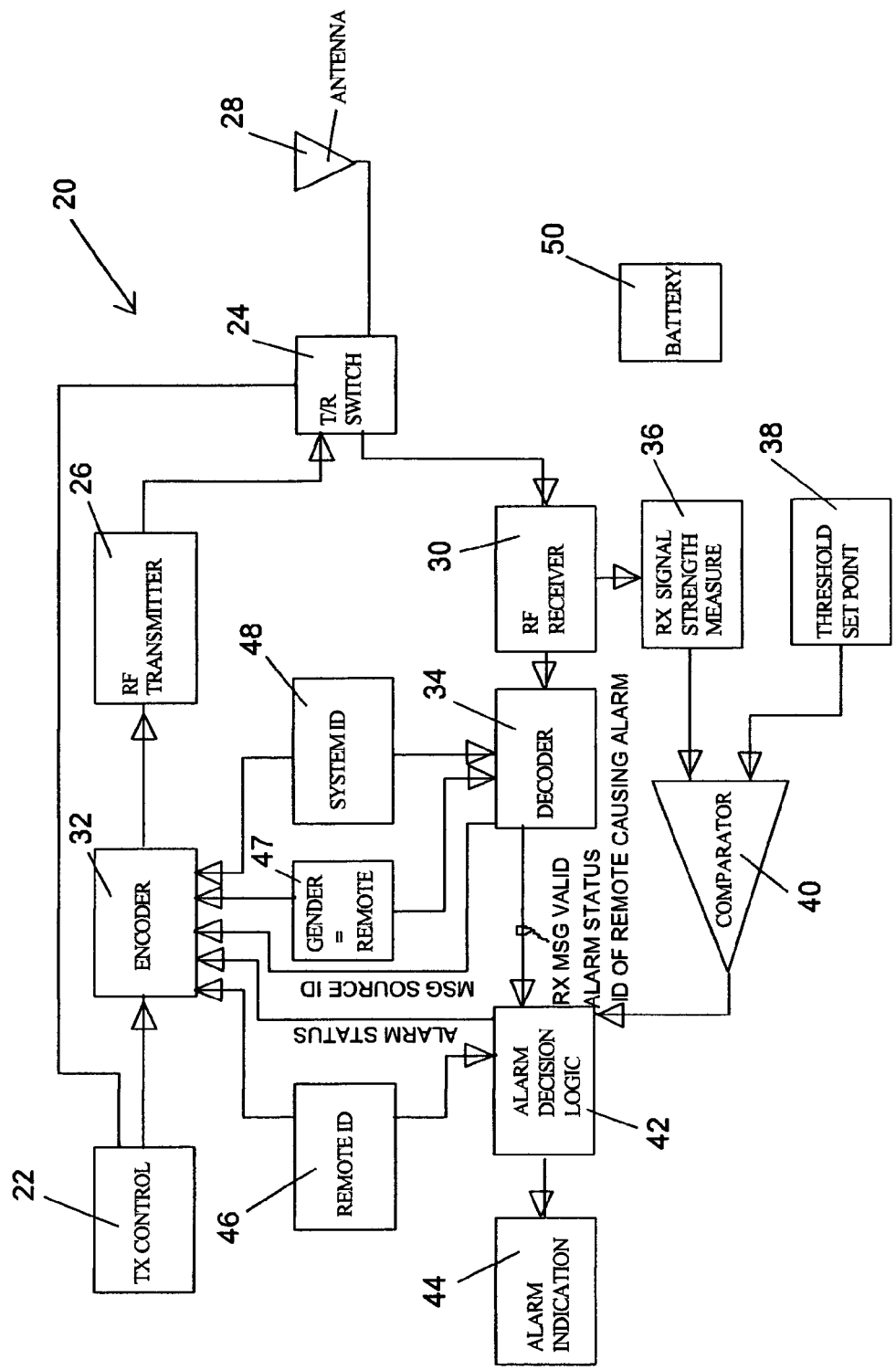
FIG. 3 is a block diagram of a remote module capable of both transmitting and receiving.

FIG. 3 shows a block diagram of the functional system 20 of a typical remote module 14, 16 according to the preferred embodiment. The Tx control 22 initiates and controls the radio transmission. The period between transmissions is a pseudo-random time and is approximately one half second. When the module is transmitting, the T/R switch 24 is controlled to connect the transmitter 26 to the antenna 28. This also isolates the radio frequency (RF) receiver 30 from the RF transmitter 26.

The encoder 32 formats the digital contents of the radio message. The various message formats are disclosed below. The encoder 32 also controls the modulation of the RF transmitter 26. The contents of the digital messages include the system identifier (ID), message source type, unique ID of the remote module, alarm status flag, and optionally the ID of a master module that is over the received signal strength threshold, and is causing the remote module to be in the alarm status.

The RF transmitter 26 converts the incoming digital stream to the appropriate radio signals and the antenna 28 radiates the RF signal in the air in an omni-directional pattern.

The T/R switch 24 connects the antenna 28 to either the RF transmitter 26 or the RF receiver 30 as controlled by the Tx controller 22.

The RF receiver 30 converts the incoming radio signals received by the antenna 28 to digital baseband signals.

The decoder 34 performs functions of message synchronization and data decoding. Incoming messages are checked for system ID and source. The message contents are made available to the decision logic after the system ID and message source have been verified by the decoder 34; this is signaled by a valid message indicator.

The Rx signal strength measurement sensor 36 measures the radio signal strength of the incoming message.

The threshold set point input 38 presents a predetermined level to the comparator 40. This predetermined level is calibrated to coincide with a desired signal strength and in turn a desired minimum allowed proximity distance.

The comparator 40 generates an active output when the received signal strength is greater than the threshold.

The alarm decision logic processor 42 processes the incoming message contents and the signal strength comparator output, and determines if the alarm should be activated. An alarm is initiated in one of two ways. In the first way, the alarm decision logic processor 42 samples the comparator output during a valid message, and if the incoming radio message has a signal strength greater than the threshold set point, then an alarm is initiated, by signaling the alarm indication output 44 and updating the alarm status flag to the encoder 32. In the second way, if the alarm status flag from the message indicates an active alarm present at the master module 12, and the ID of the remote module 14, 16 causing the alarm at the master module 12 matches the ID of the remote module 14, 16 receiving the message, then an alarm condition is also signaled.

The alarm indication output 44 turns on the audible and/or visible alarm indicators when triggered by the alarm decision logic processor 42. The alarm will be active until the alarm condition goes away as determined by the alarm decision logic processor 42 and after a timeout period.

The remote ID unit 46 contains the unique digital address of the remote module 14, 16. This ID is made available to the encoder 32 and to the alarm decision logic processor 42.

The threat warning system ID unit 48 contains the unique digital address of the threat warning system. The remote gender ID unit 47 identifies this module as a remote gender unit. The remote gender ID unit 47 and the threat warning system ID unit 48 assist in validating the radio message contents.

The remote module is supplied electrical power from an integral battery pack 50.

FIG. 3 also shows two signal protocols which will result in the generation of an alarm at the receiving remote module. In Protocol A, a local alarm is generated at the receiving remote module if the received system ID matches the system ID of the remote module, the signal is received from a master gender module, and the received signal strength is greater than a predetermined threshold. In Protocol B, a local alarm is generated if the received system ID matches the system ID of the receiving remote module, the signal is received from a master gender module, the transmitting master module is alarming, and the unique identifier of the remote module causing the master module to alarm matches the unique identifier of the receiving remote module.

Figure 4:
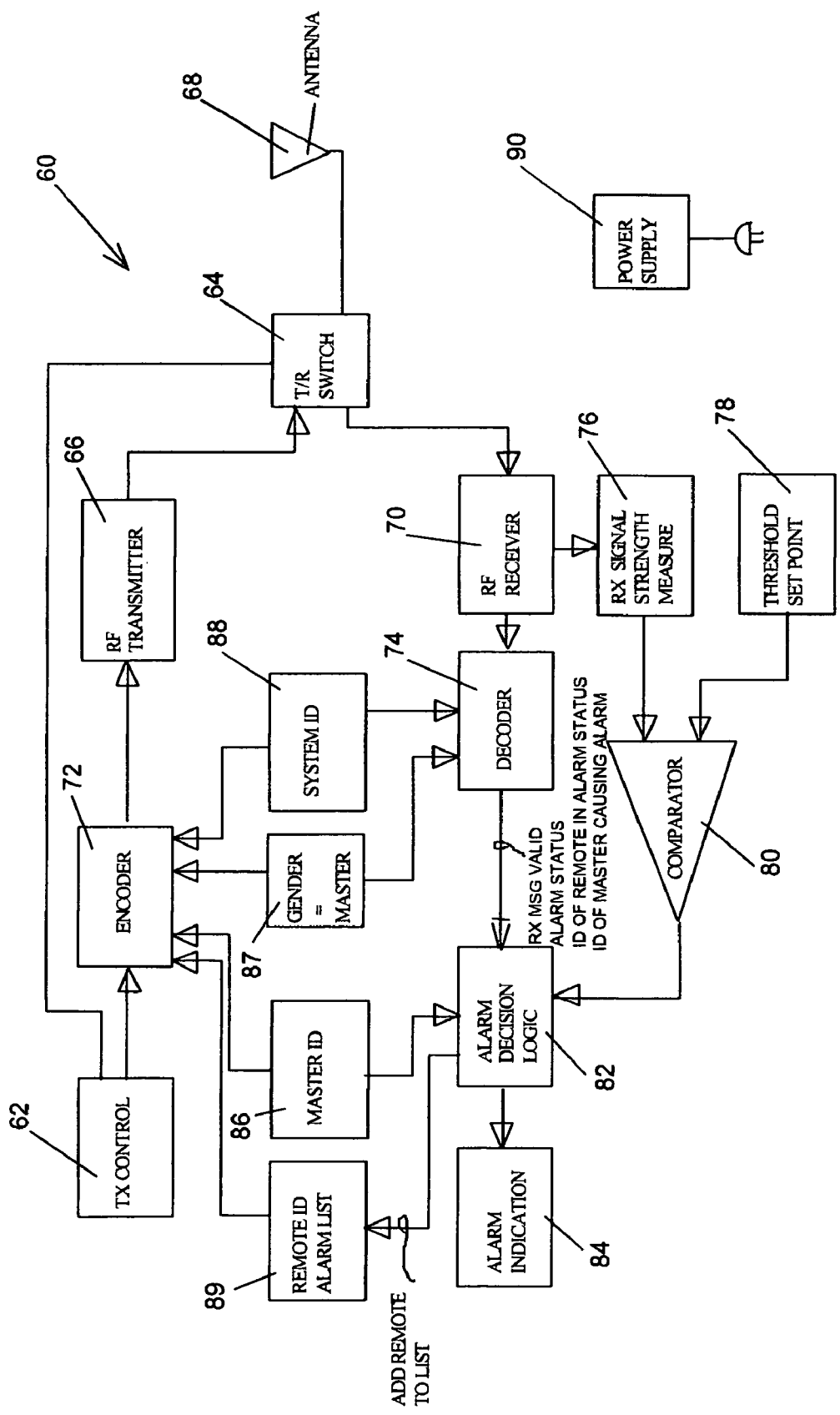
FIG. 4 is a block diagram of a master module capable of both transmitting and receiving.

FIG. 4 shows a block diagram of the functional system 60 of a typical master module 12 according to the preferred embodiment. The Tx control 62 functions the same as the Tx control 22 disclosed for the remote module in FIG. 3.

The encoder 72 formats the digital contents of the radio message. The various message formats are disclosed below. The encoder 72 also controls the modulation of the RF transmitter 66. The contents of the digital messages include the threat warning system ID, the gender of the message source unit, the master ID of this module, an alarm status flag, and optionally the ID of a remote module which transmitted a signal that is over the received signal strength threshold, and is causing the master module to be in the alarm status. The remote module ID over the signal strength is taken from a circular remote ID alarm list 89.

The RF transmitter 66, T/R switch 64, RF receiver 70 and the antenna 68 function the same as similar items disclosed for the remote module in FIG. 3.

The decoder 74 performs functions of message synchronization and data decoding. Incoming messages are checked for threat warning system ID and source gender. The message contents are made available to the decision logic processor 82 after the system ID and message source gender have been verified by the decoder 74, and this is signaled by a valid message indicator.

The Rx signal strength measurement sensor 76, the threshold set point input 78, and the comparator 80 function the same as similar units disclosed for the remote module in FIG. 3.

The alarm decision logic processor 82 processes the incoming message contents and the signal strength comparator 80 output, and determines if an alarm should be activated. An alarm is initiated in one of two ways. In one way, the alarm decision logic processor 82 samples the comparator 80 output during a valid message, and if the incoming radio message has a signal strength greater than the threshold set point, then an alarm is initiated, by signaling the alarm indication output 84 and updating the alarm status flag to the encoder 72. Second, if the alarm status flag from the message indicates an active alarm present at a remote module, and the ID of the master module causing the alarm at the remote matches the ID of the master module receiving the message, then an alarm condition is also signaled.

The alarm indication is the same as disclosed for the remote. However, the alarm indicators can be more elaborate since the master module power supply 90 can draw AC power from the electrical system in the building.

The master ID unit 86 contains the unique digital address of the master module 12. This ID is made available to the encoder 72 and the alarm decision logic processor 82.

The threat warning system ID unit 88 contains the unique digital address of the threat warning system. The master gender ID unit 87 identifies this module as a master gender unit. The threat warning system ID unit 88 and the master gender ID unit 87 assist in validating the radio message contents.

The remote ID alarm list 89 is a circular list of remote modules 14, 16 that are currently in the alarm mode. This list is updated by the alarm decision logic processor 82 and can be cleared out based on a set of appropriate rules.

FIG. 4 also shows two signal protocols which will result in the generation of an alarm at the receiving master module. In Protocol C, a local alarm is generated if the received system ID matches the system ID of the receiving master module, the signal is received from a remote gender module, and the received signal strength is greater than a predetermined threshold. In Protocol D, a local alarm is generated if the received system ID matches the system ID of the receiving master module, the signal is received from a remote gender module, the transmitting remote module is alarming, and the unique identifier of the master module causing the transmitting remote module to alarm matches the unique identifier of the receiving master module.

FIG. 5 shows a basic radio message format which contains a synchronization pattern, a threat warning system ID field, a message source gender field of either master or remote, a message source unique ID field, the alarm status of the transmitting module of either inactive or active, and optionally the unique source ID associated with an opposite gender module whose received signal strength has caused an alarm. Herein, a message source gender of 0 means a master gender unit transmitted the signal, and a message source gender of 1 means a remote gender unit transmitted the signal. Further, an alarm status of 0 means that the alarm is inactive, and an alarm status of 1 means that the alarm is active.

FIG. 6 shows a radio message format transmitted from a master module 12 with no alarm active.

FIG. 7 shows a radio message format transmitted from a master module 12 with an active alarm.

FIG. 8 shows a radio message format transmitted from a remote module 14, 16 with no alarm active.

FIG. 9 shows a radio message format transmitted from a remote module 14, 16 with an active alarm.

In an alternative second embodiment of the invention, the threat warning system can operate using a one-way radio link, where the master module contains only a receiver and each of the remote modules contains only a transmitter. In this embodiment, the master module initiates an alarm if it receives a radio signal from a remote module that is above the predetermined threshold signal strength. This embodiment does not provide the redundancy described above for the preferred embodiment.

Figure 10:
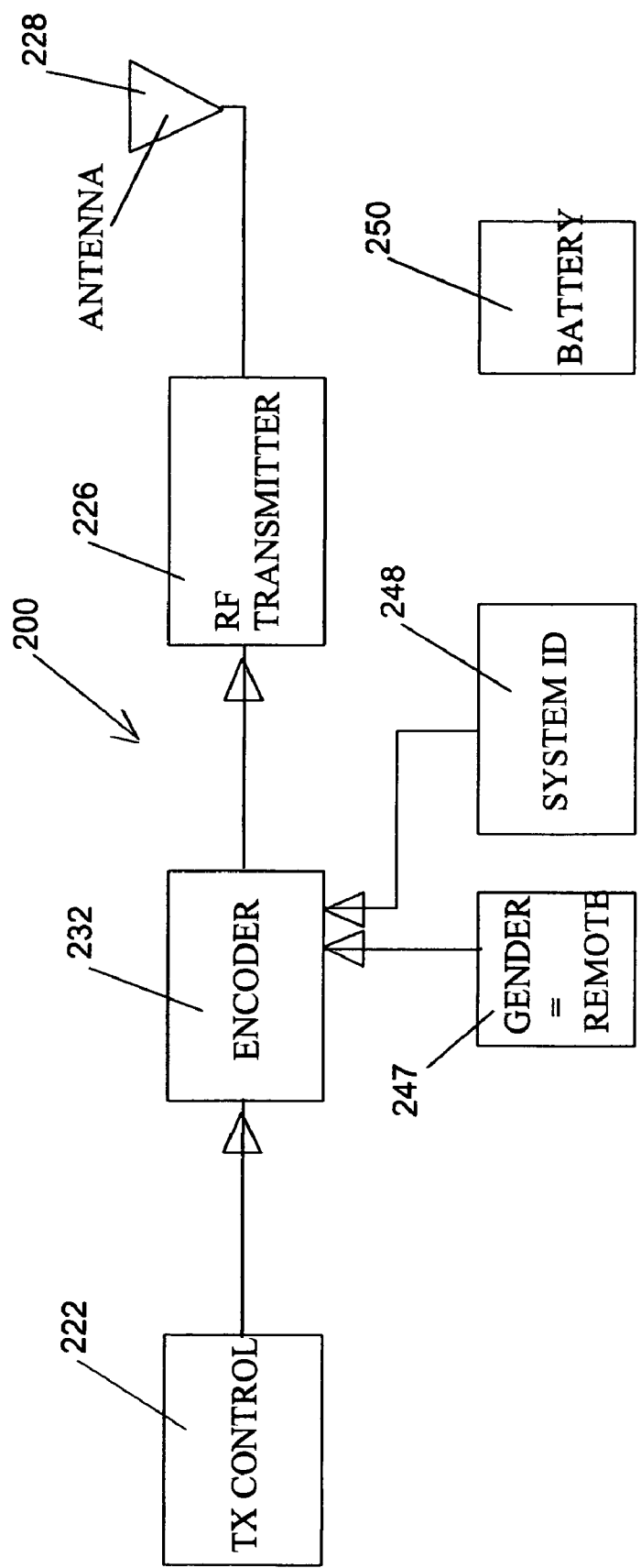
FIG. 10 is a block diagram of a remote module capable only of transmitting, in a second embodiment.

FIG. 10 shows a block diagram of the functional system 200 of a typical remote module according to the aforementioned alternative second embodiment. This embodiment includes a Tx control 222, an encoder 232, a remote gender ID unit 247, a system ID unit 248, an RF transmitter 226, and an antenna 228.

The Tx control 222 initiates and controls the radio transmission. The period between transmissions is a pseudo-random time and is approximately one half second.

The encoder 232 formats the digital contents of the radio message. The encoder 232 also controls the modulation of the RF transmitter 226. The contents of the digital messages include the system ID and the message source gender.

The RF transmitter 226 converts the incoming digital stream to the appropriate radio signals and the antenna 228 radiates the RF signal in the air in an omni-directional pattern.

The remote module is supplied electrical power from an integral battery pack 250.

Figure 11:
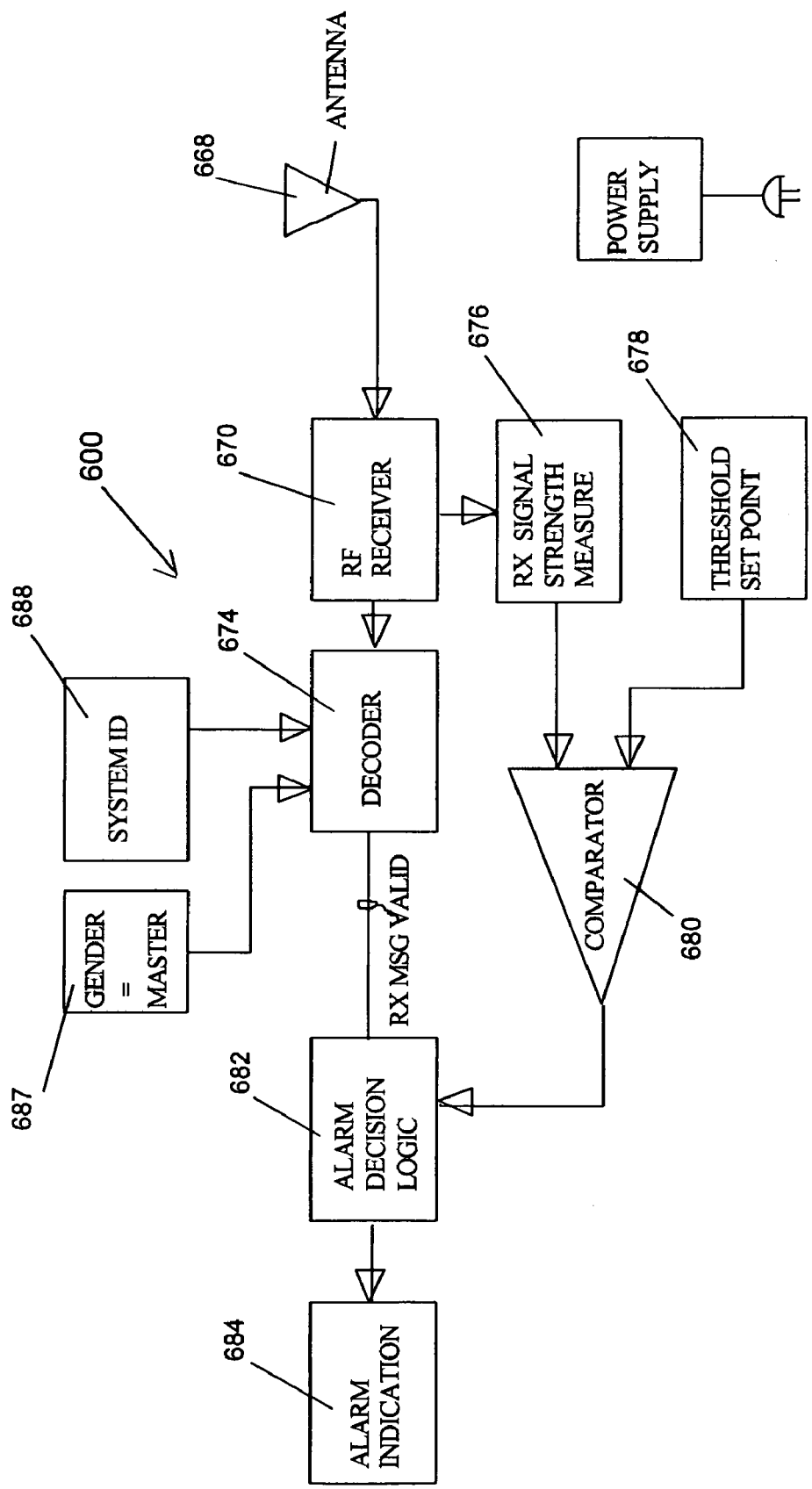
FIG. 11 is a block diagram of a master module capable only of receiving.

FIG. 11 shows a block diagram of the functional system 600 of a typical master module according to the aforementioned alternative second embodiment. An RF receiver 670, converts the incoming radio signals received by the antenna 668 to digital baseband signals.

A decoder 674 performs functions of message synchronization and data decoding. Incoming messages are checked for system ID and source gender, and if verified correctly, this generates a valid message indicator.

The Rx signal strength measurement sensor 676 measures the radio signal strength of the incoming message.

The threshold set point input 678 presents a predetermined level to the comparator 680. This predetermined level is calibrated to coincide with a desired signal strength and in turn a desired minimum allowed proximity distance.

The comparator 680 generates an active output when the received signal strength is greater than the threshold.

The alarm decision logic processor 682 samples the comparator 680 output during a valid message, if the incoming radio message has a signal strength greater than the threshold set point, then an alarm is initiated, by signaling the alarm indication output 684.

The alarm indication output 684 is the same as disclosed for the master module in FIG. 4.

The threat warning system ID unit 688 contains the unique digital address of the threat warning system. The master gender ID unit 687 identifies this module as a master gender unit. The threat warning system ID unit 688 and the master gender ID unit 687 assist in validating the radio message contents.

Figure 12:
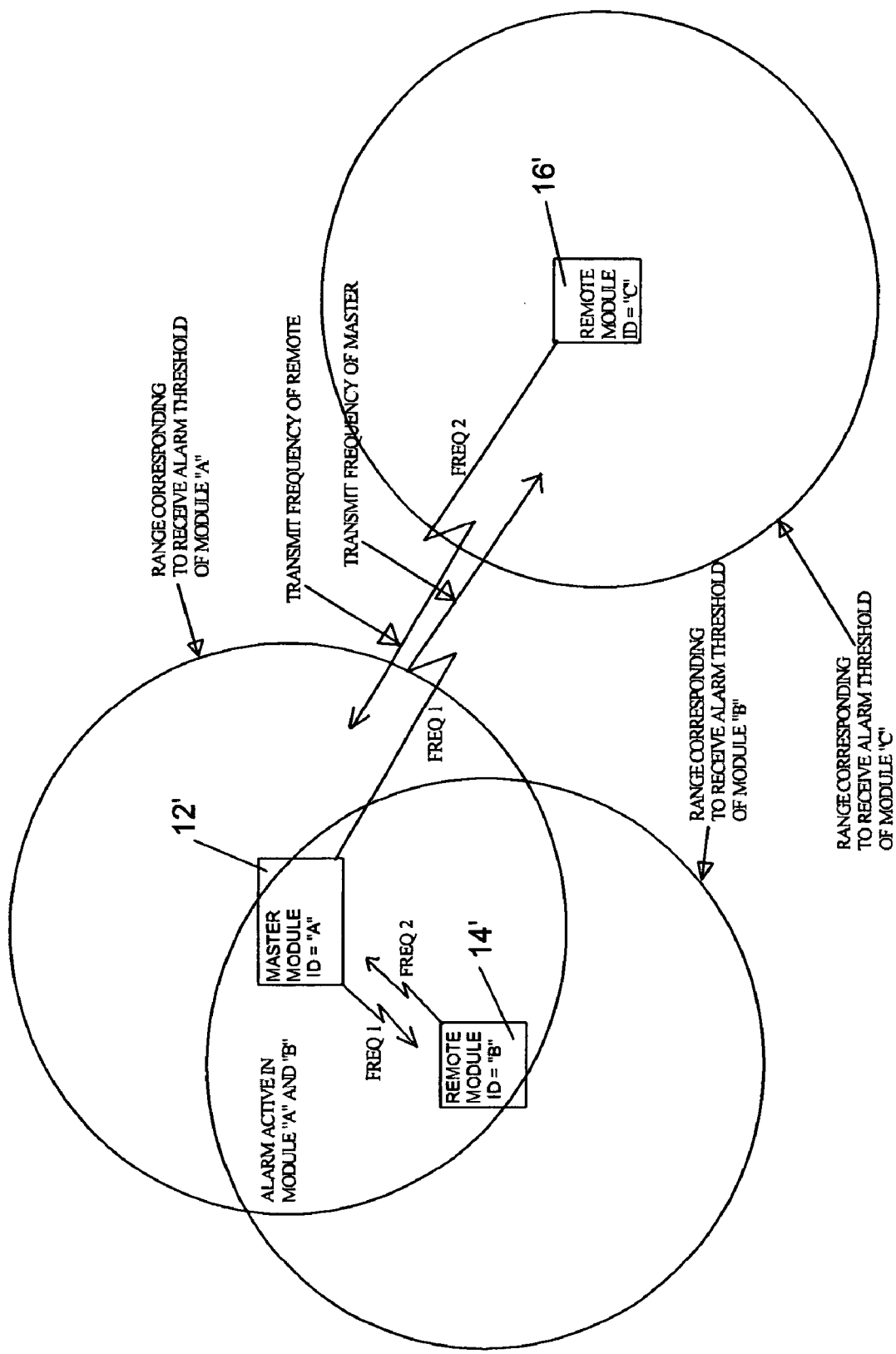
FIG. 12 illustrates the triggering relationship between modules in a third embodiment.

FIG. 12 illustrates the first means of initiating an alarm, via the signal strength, in an alternative third embodiment. If a radio signal is received from the same system identification, from an opposite gender of radio unit, and is above a predetermined receive threshold, then a local alarm condition is activated at the receiving module. The circles represent the distance corresponding to a predetermined received signal strength at which an alarm is to be generated. A local alarm condition can result in activating the local visible and audible alarm outputs associated with the receiving module. In this embodiment, the master module 12' transmits at a first frequency, denoted as "frequency 1", and listens at a second frequency, denoted as "frequency 2". Also, the remote modules 14', 16' transmit at frequency 2 and listen at frequency 1.

Figure 13:
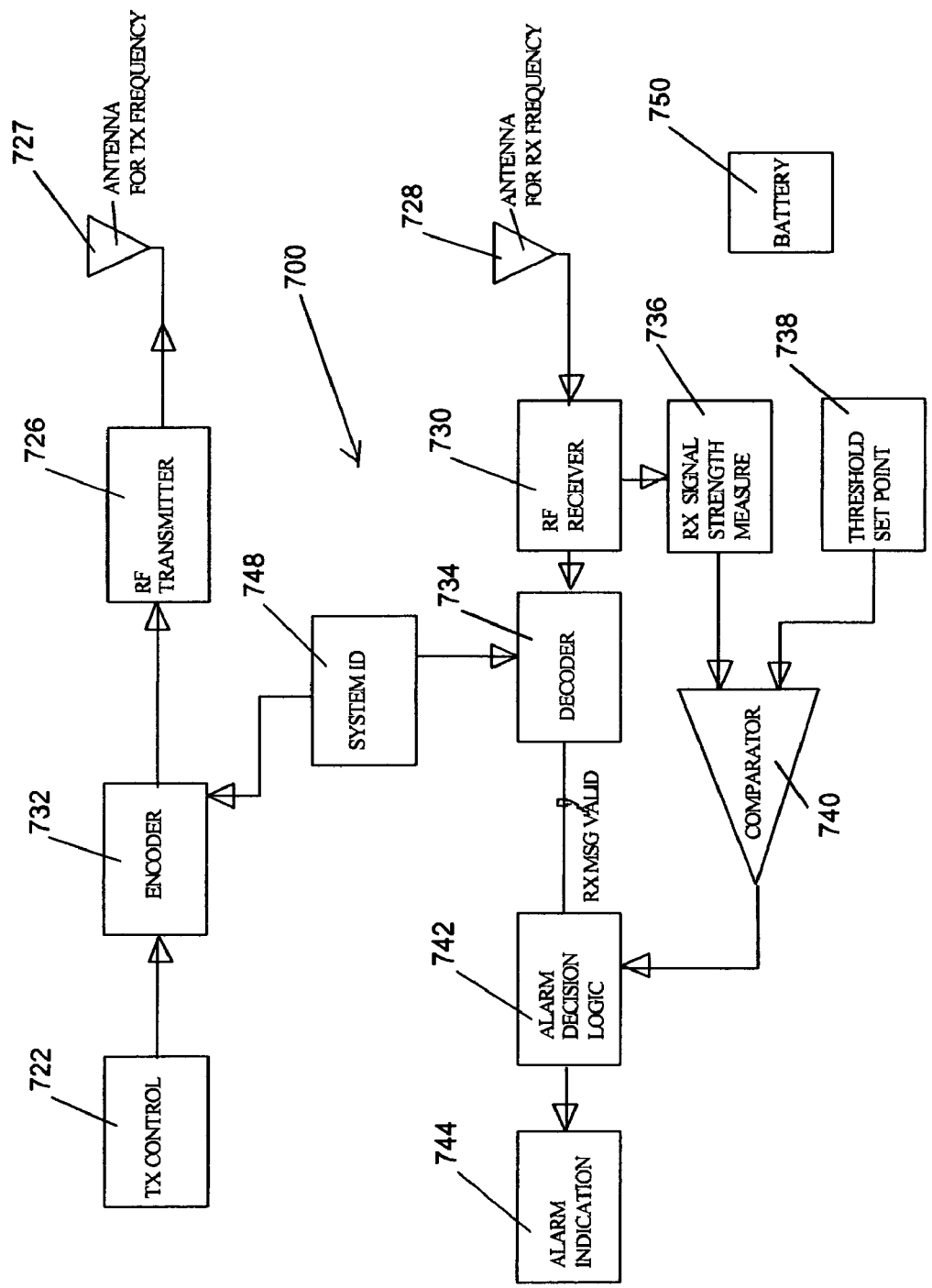
FIG. 13 is a block diagram of a remote module capable of both transmitting and receiving, in the third embodiment.

FIG. 13 shows a block diagram of the functional system 700 of a typical remote module 14', 16' according to the alternative third embodiment. The Tx control 722 initiates and controls the radio transmission. The period between transmissions is a pseudo-random time and is approximately one half second. When the module is transmitting, the transmitter 726 is connected to the transmitting antenna 727.

The encoder 732 formats the digital contents of the radio message. The encoder 732 also controls the modulation of the RF transmitter 726. The contents of the digital messages include the system identifier (ID).

The RF transmitter 726 converts the incoming digital stream to the appropriate radio signals and the transmitting antenna 727 radiates the RF signal in the air in an omni-directional pattern.

The RF receiver 730 converts the incoming radio signals received by the receiving antenna 728 to digital baseband signals.

The decoder 734 performs functions of message synchronization and data decoding. Incoming messages are checked for system ID. The message contents are made available to the decision logic after the system ID has been verified by the decoder 734; this is signaled by a valid message indicator.

The Rx signal strength measurement sensor 736 measures the radio signal strength of the incoming message.

The threshold set point input 738 presents a predetermined level to the comparator 740. This predetermined level is calibrated to coincide with a desired signal strength and in turn a desired minimum allowed proximity distance.

The comparator 740 generates an active output when the received signal strength is greater than the threshold.

The alarm decision logic processor 742 processes the incoming message contents and the signal strength comparator output, and determines if the alarm should be activated. The alarm decision logic processor 742 samples the comparator output during a valid message, and if the incoming radio message has a signal strength greater than the threshold set point, then an alarm is initiated, by signaling the alarm indication output 744.

The alarm indication output 744 turns on the audible and/or visible alarm indicators when triggered by the alarm decision logic processor 742. The alarm will be active until the alarm condition goes away as determined by the alarm decision logic processor 742 and after a timeout period.

The threat warning system ID unit 748 contains the unique digital address of the threat warning system. The threat warning system ID unit 748 assists in validating the radio message contents. The remote module is supplied electrical power from an integral battery pack 750.

FIG. 13 also shows a signal protocol which will result in the generation of an alarm at the receiving remote module. In Protocol F, a local alarm is generated at the receiving remote module if the received system ID matches the system ID of the receiving remote module, and the received signal strength is greater than a predetermined threshold.

Figure 14:
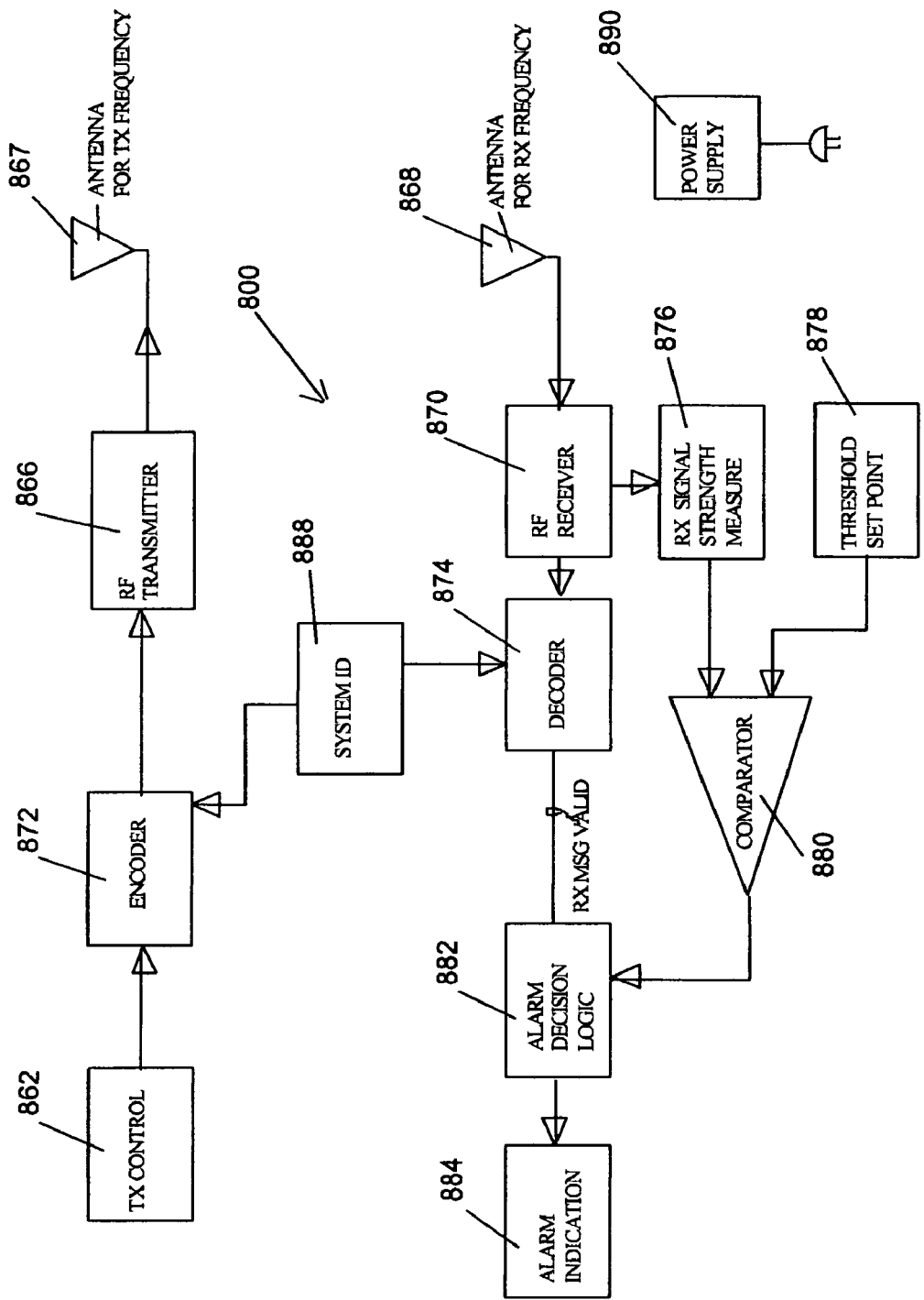
FIG. 14 is a block diagram of a master module capable of both transmitting and receiving, in the third embodiment.

FIG. 14 shows a block diagram of the functional system 800 of a typical master module 12' according to the alternative third embodiment. The Tx control 862 functions the same as the Tx control 722 disclosed for the remote module in FIG. 13.

The encoder 872 formats the digital contents of the radio message. The encoder 872 also controls the modulation of the RF transmitter 866. The contents of the digital messages include the threat warning system ID.

The RF transmitter 866, RF receiver 870, the transmitting antenna 867, and the receiving antenna 868 function the same as similar items disclosed for the remote module in FIG. 13.

The decoder 874 performs functions of message synchronization and data decoding. Incoming messages are checked for threat warning system ID. The message contents are made available to the decision logic processor 882 after the system ID has been verified by the decoder 874, and this is signaled by a valid message indicator.

The Rx signal strength measurement sensor 876, the threshold set point input 878, and the comparator 880 function the same as similar units disclosed for the remote module in FIG. 13.

The alarm decision logic processor 882 processes the incoming message contents and the signal strength comparator 880 output, and determines if an alarm should be activated. The alarm decision logic processor 882 samples the comparator 880 output during a valid message, and if the incoming radio message has a signal strength greater than the threshold set point, then an alarm is initiated, by signaling the alarm indication output 884.

The alarm indication is the same as disclosed for the remote. However, the alarm indicators can be more elaborate since the master module power supply 890 can draw AC power from the electrical system in the building.

The threat warning system ID unit 888 contains the unique digital address of the threat warning system. The threat warning system ID unit 888 assists in validating the radio message contents.

FIG. 14 also shows a signal protocol which will result in the generation of an alarm at the receiving master module. In Protocol G, a local alarm is generated if the received system ID matches the system ID of the master module, and the received signal strength is greater than a predetermined threshold.

Figure 15:
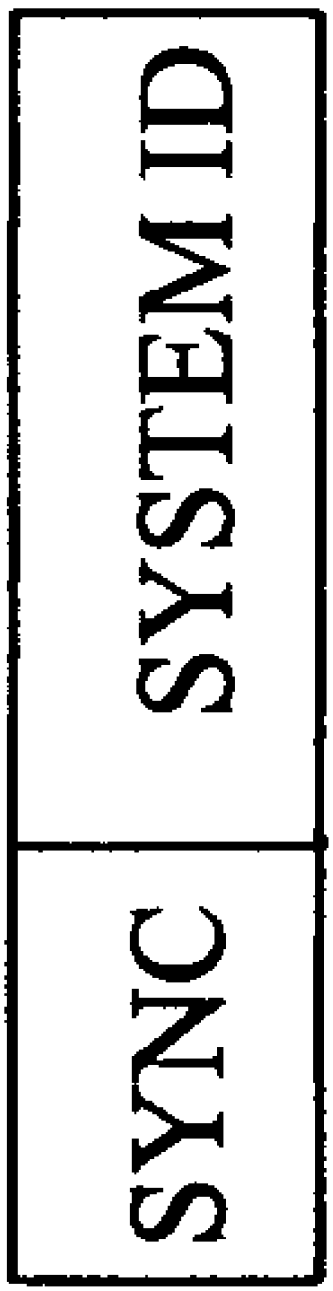
FIG. 15 illustrates the basic radio digital message format, in the third embodiment.

FIG. 15 shows a basic radio message format for the alternative third embodiment, which contains a synchronization pattern and a threat warning system ID field.

Figure 16:
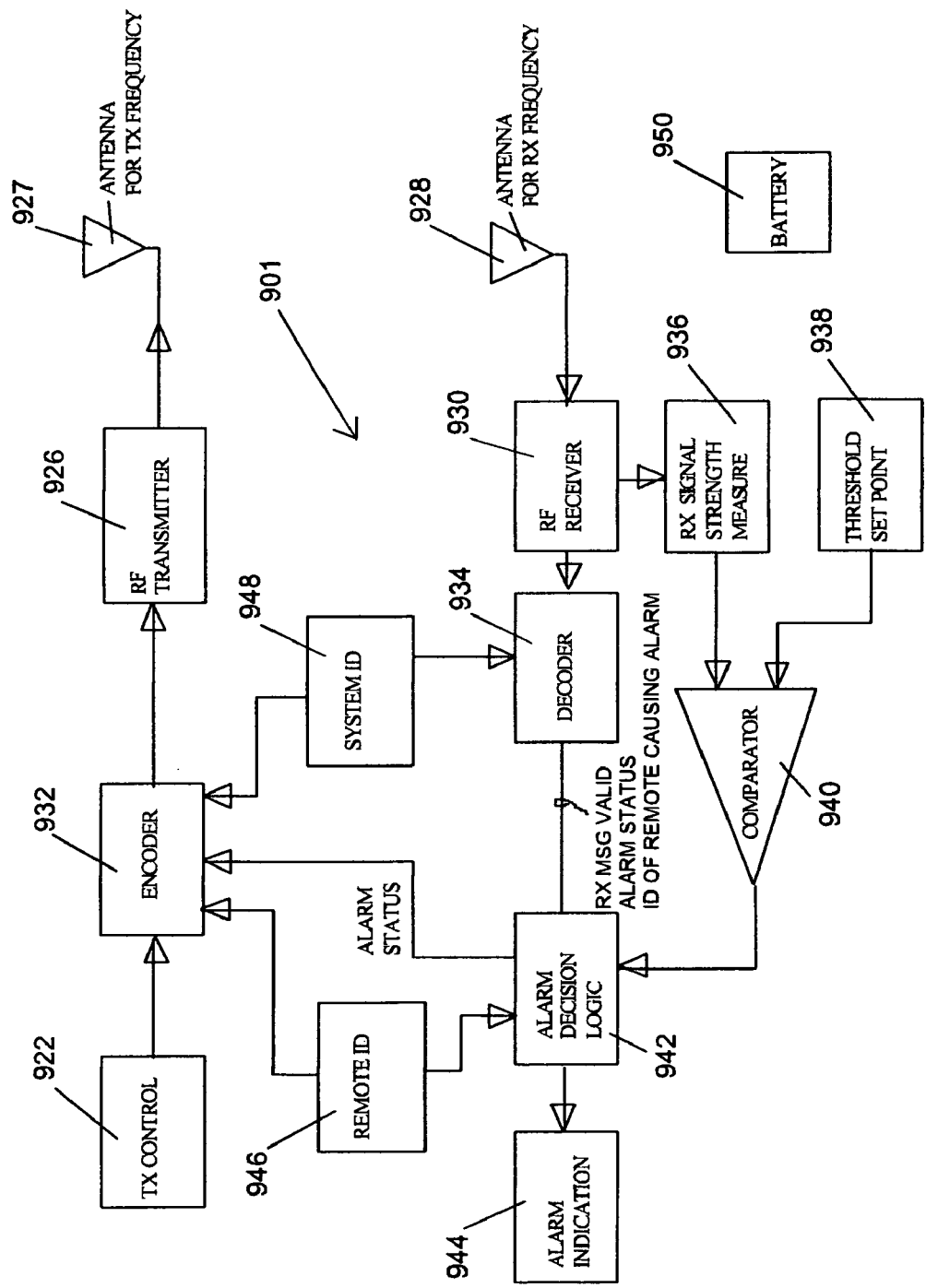
FIG. 16 is a block diagram of a remote module in a fourth embodiment.

FIG. 16 shows a flow diagram of the functional system 901 of a typical remote module according to an alternative fourth embodiment, which is similar to the third embodiment, except that it incorporates a "mutual reinforcement" dual alarming mode. The Tx control 922 initiates and controls the radio transmission. The period between transmissions is a pseudo-random time and is approximately one half second. When the module is transmitting, the transmitter 926 is connected to the transmitting antenna 927.

The encoder 932 formats the digital contents of the radio message. The encoder 932 also controls the modulation of the RF transmitter 926. The contents of the digital messages include the system identifier (ID), the unique remote module identifier, and the alarm status.

The RF transmitter 926 converts the incoming digital stream to the appropriate radio signals and the transmitting antenna 927 radiates the RF signal in the air in an omni-directional pattern.

The RF receiver 930 converts the incoming radio signals received by the receiving antenna 928 to digital baseband signals.

The decoder 934 performs functions of message synchronization and data decoding. Incoming messages are checked for system ID. The message contents are made available to the decision logic after the system ID has been verified by the decoder 934; this is signaled by a valid message indicator.

The Rx signal strength measurement sensor 936 measures the radio signal strength of the incoming message.

The threshold set point input 938 presents a predetermined level to the comparator 940. This predetermined level is calibrated to coincide with a desired signal strength and in turn a desired minimum allowed proximity distance.

The comparator 940 generates an active output when the received signal strength is greater than the threshold.

The alarm decision logic processor 942 processes the incoming message contents and the signal strength comparator output, and determines if the alarm should be activated, in either of two ways. In the first way, the alarm decision logic processor 942 samples the comparator output during a valid message, and if the incoming radio message has a signal strength greater than the threshold set point, then an alarm is initiated, by signaling the alarm indication output 944. In the second way, if the alarm status flag from the message indicates an active alarm present at the master module, and the ID of the remote module causing the alarm at the master module matches the ID of the remote module receiving the message, then an alarm condition is also signaled.

The alarm indication output 944 turns on the audible and/or visible alarm indicators when triggered by the alarm decision logic processor 942. The alarm will be active until the alarm condition goes away as determined by the alarm decision logic processor 942 and after a timeout period.

The remote ID unit 946 contains the unique digital address of the remote module. This ID is made available to the encoder 932 and to the alarm decision logic processor 942.

The threat warning system ID unit 948 contains the unique digital address of the threat warning system. The threat warning system ID unit 948 assists in validating the radio message contents. The remote module is supplied electrical power from an integral battery pack 950.

FIG. 16 also shows two signal protocols which will result in the generation of an alarm at the receiving remote module. In Protocol H, a local alarm is generated at the receiving remote module if the received system ID matches the system ID of the receiving remote module, and the received signal strength is greater than a predetermined threshold. In Protocol I, a local alarm is generated at the receiving remote module if the received system ID matches the system ID of the remote module, if the transmitting master module is alarming, and if the ID of a remote module causing an alarm at the master module matches the ID of the receiving remote module.

Figure 17:
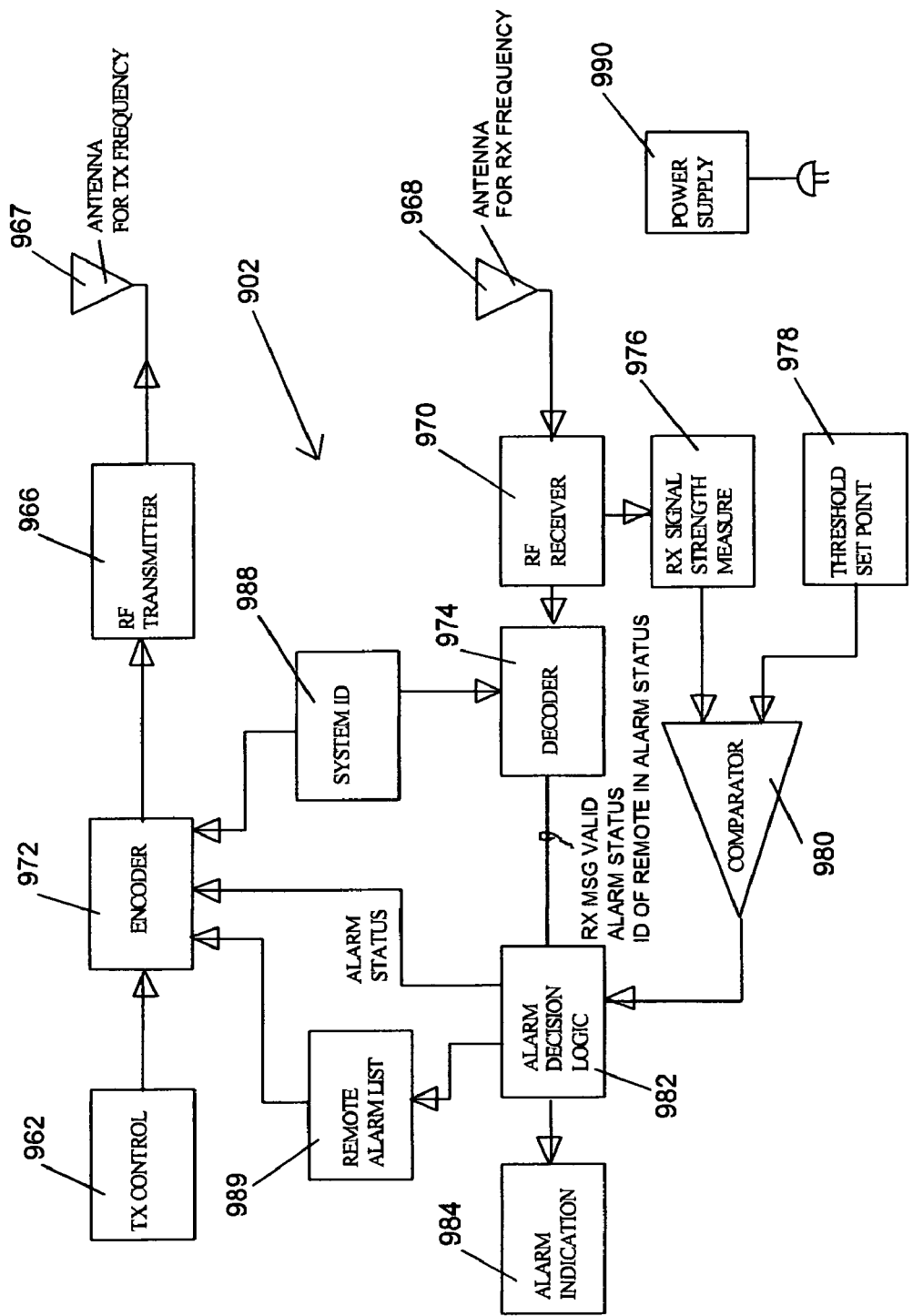
FIG. 17 is a block diagram of a master module in the fourth embodiment.

FIG. 17 shows a flow diagram of the functional system 902 of a typical master module according to the alternative fourth embodiment, which is similar to the third embodiment, except that it incorporates a "mutual reinforcement" dual alarming mode. The Tx control 962 functions the same as the Tx control 922 disclosed for the remote module in FIG. 16.

The encoder 972 formats the digital contents of the radio message. The encoder 972 also controls the modulation of the RF transmitter 966. The contents of the digital messages include the threat warning system ID, the alarm status, and optionally the ID of a remote module which transmitted a signal that is over the received signal strength threshold, and is causing the master module to be in the alarm status. The remote module ID over the signal strength is taken from a circular remote ID alarm list 989. This embodiment illustrates the use of only one master module per system, so no master module unique identifier is necessary. Two or more master modules could be used in a single system, as illustrated in the preferred embodiment, in which case a master module unique identifier would be provided, as illustrated with the preferred embodiment.

The RF transmitter 966, RF receiver 970, the transmitting antenna 967, and the receiving antenna 968 function the same as similar items disclosed for the remote module in FIG. 16.

The decoder 974 performs functions of message synchronization and data decoding. Incoming messages are checked for threat warning system ID. The message contents are made available to the decision logic processor 982 after the system ID has been verified by the decoder 974, and this is signaled by a valid message indicator.

The Rx signal strength measurement sensor 976, the threshold set point input 978, and the comparator 980 function the same as similar units disclosed for the remote module in FIG. 16.

The alarm decision logic processor 982 processes the incoming message contents and the signal strength comparator 980 output, and determines if an alarm should be activated. Alarms can be activated in two ways. In one way, the alarm decision logic processor 982 samples the comparator 980 output during a valid message, and if the incoming radio message has a signal strength greater than the threshold set point, then an alarm is initiated, by signaling the alarm indication output 984. Second, if the alarm status flag from the message indicates an active alarm present at a remote module, then an alarm condition is also signaled. If two or more master modules were used, as described above in the preferred embodiment, the receiving master module would also compare its own unique identifier with the unique identifier of the master module causing the remote module to go into alarm mode, before generating a "mutual reinforcement" alarm. The additional logic blocks required for the use of two or more master modules would be as shown in FIGS. 3 and 4.

The alarm indication is the same as disclosed for the remote. However, the alarm indicators can be more elaborate since the master module power supply 990 can draw AC power from the electrical system in the building.

The threat warning system ID unit 988 contains the unique digital address of the threat warning system. The threat warning system ID unit 988 assists in validating the radio message contents.

FIG. 17 also shows two signal protocols which will result in the generation of an alarm at the receiving master module. In Protocol J, a local alarm is generated if the received system ID matches the system ID of the master module, and the received signal strength is greater than a predetermined threshold. In Protocol K, a local alarm is generated if the received system ID matches the system ID of the master module, and if the transmitting remote module has an active alarm. If two or more master modules were to be used in a system in this embodiment, Protocol K would generate a local alarm at the receiving master module if the received system ID matches the system ID of the master module, if the transmitting remote module has an active alarm, and if the ID of the master module causing the remote module to alarm matches the ID of the receiving master module.

FIG. 18 shows basic radio message formats for the remote and master modules of the alternative fourth embodiment, which contains a synchronization pattern, a threat warning system ID field, an alarm status field, and a source ID field. In the signal from the remote unit to the master unit, the source ID field gives the unique identifier of the remote module transmitting the signal (the signal source ID), so that the master unit can identify any remote unit which approaches too close. In the signal from the master unit to the remote unit, the source ID field identifies any remote module which has approached too close and caused an alarm at the master module (the alarm source ID). If two or more master modules were to be used in a system in this embodiment, both the master module and the remote module would generate signals with both a signal source ID field and an alarm source ID field.

While the particular invention as herein shown and disclosed in detail is fully capable of obtaining the objects and providing the advantages hereinbefore stated, it is to be understood that this disclosure is merely illustrative of the presently preferred embodiments of the invention and that no limitations are intended other than as described in the appended claims.

I claim:

1. A ferromagnetic threat warning system, comprising:
    a first radio unit mountable to a ferromagnetic threat object;
    a second radio unit mountable at a door to an area to be protected against entry of a ferromagnetic threat object, at least one of said first radio unit and said second radio unit being adapted to transmit radio frequency signals, said signals being adapted to indicate whether said signals are transmitted by said first radio unit or said second radio unit, at least the other of said first radio unit and said second radio unit being adapted to receive radio signals;
    a signal strength sensor in at least said other of said first radio unit and said second radio unit, said signal strength sensor being adapted to measure the strength of received radio frequency signals; and
    a processing device in at least said other of said first radio unit and said second radio unit, said processing device being adapted to generate a ferromagnetic threat proximity alarm when the following conditions are met:
        (1) said measured strength of a received radio frequency signal reaches a predetermined level, said predetermined signal strength level being selected to indicate approach of said first radio unit within a preselected distance of said second radio unit; and
        (2) said other of said first radio unit and said second radio unit identifies said received signal as being transmitted by said one of said first radio unit and said second radio unit.

2. The system recited in claim 1, further comprising a plurality of said first radio units, each said first radio unit being mountable to a ferromagnetic threat object.

3. The system recited in claim 1, further comprising a plurality of said second radio units, each said second radio unit being mountable at a door to an area to be protected against entry of a ferromagnetic threat object.

4. The system recited in claim 1, wherein:
said first radio unit is only adapted to transmit said signals; and
said second radio unit is only adapted to receive said signal and generate said alarm.

5. The system recited in claim 1, wherein:
said first radio unit and said second radio unit are both adapted to transmit radio frequency signals, said signals being adapted to indicate whether said signals are transmitted by said first radio unit or said second radio unit; and
said first radio unit and said second radio unit are both adapted to receive radio signals; and
further comprising:
said signal strength sensors in both of said first radio unit and said second radio unit; and
said processing devices in both of said first radio unit and said second radio unit.

6. The system recited in claim 5, wherein said first radio unit and said second radio unit generate said signals at different frequencies, in order to identify whether each said signal is generated by said first radio unit or said second radio unit.

7. The system recited in claim 5, further comprising:
a master/remote identification device mounted with each of said first and second radio units, said master/remote indicating device being adapted to encode signals transmitted by said respective radio unit to indicate whether said radio unit is said first radio unit or said second radio unit; and
a decoder mounted with each of said first and second radio units, said decoder being adapted to decode said radio frequency signals to verify that a signal received by one of said first or second radio units was transmitted by the other of said first and second radio units.

8. The system recited in claim 5, wherein:
each said processor is further adapted to generate a second radio frequency signal indicating when an alarm has been generated by said processor in one said radio unit based on receipt of a predetermined level signal from another said radio unit, said second radio frequency signal being adapted to identify said other radio unit; and
said processor in said other radio unit is further adapted to generate an alarm upon receipt of said second signal indicating that an alarm has been generated by said processor in said one radio unit, when said second signal indicates that said alarm resulted from receipt of a predetermined level signal from said other radio unit.

9. The system recited in claim 8, further comprising a unit identification device in each said radio unit adapted to code said predetermined level signal with a unique radio unit identifier, wherein said second radio frequency signal generated by said one radio unit is coded to indicate the unique identifier of said other radio unit.

10. A ferromagnetic threat warning system, comprising:
at least one master gender radio unit mountable near at least one door to an area to be protected against entry of a ferromagnetic threat object;
at least one remote gender radio unit, each said remote gender radio unit being mountable to a ferromagnetic threat object;
a first radio frequency communication device in one of said at least one master gender radio unit or said at least one remote gender radio unit;
a second radio frequency communication device in the other of said at least one master gender radio unit or said at least one remote gender radio unit;
a signal strength sensor mounted with said second radio frequency communication device, said signal strength sensor being adapted to measure the strength of radio frequency signals received by said second radio frequency communication device from said first radio frequency communication device;
a master/remote identification device mounted with said first radio frequency communication device, said master/remote indicating device being adapted to encode signals transmitted by said first radio frequency communication device to indicate whether said first radio frequency communication device is in said master gender radio unit or said at least one remote gender radio unit;
a decoder mounted with said second radio frequency communication device, said decoder being adapted to decode said radio frequency signals to verify that said first radio frequency communication device is in a different gender radio unit than said second radio frequency communication device; and
a processing device mounted with said second radio frequency communication device, said processing device being adapted to generate a ferromagnetic threat proximity alarm when the following conditions are met:
(1) said measured strength of one of said radio frequency signals received by said second radio frequency communication device reaches a predetermined level, said predetermined signal strength level being selected to indicate approach of said at least one remote gender radio unit within a preselected distance of said at least one master gender radio unit; and
(2) said first radio frequency communication device is in a different gender radio unit than said second radio frequency communication device.

11. The system recited in claim 10, further comprising a plurality of said remote gender radio units, each said remote gender radio unit being mountable to a ferromagnetic threat object.

12. The system recited in claim 10, wherein:
said first radio frequency communication device is in said at least one remote gender radio unit; and
said second radio frequency communication device is in said master gender radio unit.

13. The system recited in claim 10, wherein:
said first radio frequency communication device comprises a first transceiver;
said second radio frequency communication device comprises a second transceiver; and
further comprising:
a second signal strength sensor mounted with said first transceiver, said second signal strength sensor being adapted to measure the strength of radio frequency signals received by said first transceiver from said second transceiver;
a second master/remote identification device mounted with said second transceiver, said second master/remote indicating device being adapted to encode said signals transmitted by said second transceiver to indicate whether said second transceiver is in said master gender radio unit or said at least one remote gender radio unit;
a second decoder mounted with said first transceiver, said second decoder being adapted to decode said radio frequency signals to verify that said second radio frequency communication device is in a different gender radio unit than said first radio frequency communication device; and a second processing device mounted with said first transceiver, said second processing device being adapted to generate a ferromagnetic threat proximity alarm when the following conditions are met:
  (1) said measured strength of one of said radio frequency signals received by said first transceiver reaches a predetermined level, said predetermined signal strength level being selected to indicate approach of said at least one remote gender radio unit within a preselected distance of said master gender radio unit; and
  (2) said second transceiver is in a different gender radio unit than said first transceiver.

14. The system recited in claim 13, further comprising a unit identification device in each said radio unit adapted to code said signal with a unique radio unit identifier, wherein:
  each said processor is further adapted to generate a second radio frequency signal indicating when an alarm has been generated by said processor in one said radio unit based on a predetermined level signal from another said radio unit, said second radio frequency signal being coded to indicate the unique identifier of said other radio unit which generated the signal received at said predetermined level; and
  said processor in said other radio unit is further adapted to generate an alarm upon receipt of said second signal from said one radio unit indicating that an alarm has been generated by said processor in said one radio unit, when said second signal indicates that said alarm resulted from receipt of a predetermined level signal from said other radio unit.

15. A method for excluding ferromagnetic threat objects from an area, comprising:
  providing at least one master radio unit adjacent at least one door of said area;
  providing at least one remote radio unit, each said remote radio unit being mounted on one of said ferromagnetic threat objects;
  transmitting radio frequency signals with at least one of said radio units, said signal being adapted to indicate whether said signal is transmitted by said at least one master radio unit or said at least one remote radio unit;
  generating an alarm when one of said signals is received by a different radio unit, when the following conditions are met:
    (1) the strength of said received signal reaches a predetermined level indicating approach of one of said remote radio units to within a preselected distance of one of said master radio units; and
    (2) said signal is transmitted by one of said master radio unit and said remote radio unit and received by the other of said master radio unit and said remote radio unit.

16. The method recited in claim 15, wherein said signal is transmitted only by said remote radio unit and received only by said master radio unit.

17. The method recited in claim 15, further comprising transmitting said signals with said master radio unit and said remote radio unit at different frequencies, in order to identify whether each said signal is transmitted by said master radio unit or said remote radio unit.

18. The method recited in claim 15, further comprising:
  encoding said signals transmitted by said respective radio units to indicate whether said transmitting radio unit is one of said master radio units or one of said remote radio units; and
  decoding said radio frequency signals to verify that a signal received by one of said master or remote radio units was transmitted by the other of said master and remote radio units.

19. The method recited in claim 15, further comprising:
  coding each said signal with a unique radio unit identifier;
  generating a second radio frequency signal indicating when an alarm has been generated by one said radio unit based on a predetermined level signal from another said radio unit, said second radio frequency signal being coded to indicate the unique identifier of said other radio unit which generated the signal which was received at said predetermined level; and
  generating an alarm with said other radio unit upon receipt of said second signal from said one radio unit indicating that an alarm has been generated by said one radio unit, when said second signal indicates that said alarm resulted from receipt of a predetermined level signal from said other radio unit.

* * * * *